US010031412B1

(12) United States Patent
Lee et al.

(10) Patent No.: US 10,031,412 B1
(45) Date of Patent: Jul. 24, 2018

(54) PELLICLE ASSEMBLY IN PHOTOLITHOGRAPHY PROCESS AND METHOD FOR USING THE SAME

(71) Applicant: Taiwan Semiconductor Manufacturing Co., Ltd., Hsinchu (TW)

(72) Inventors: Yu-Ching Lee, Kaohsiung (TW); Yu-Piao Fang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/491,795

(22) Filed: Apr. 19, 2017

(51) Int. Cl.
*G03F 7/20* (2006.01)
*G03F 1/62* (2012.01)
*G03F 1/64* (2012.01)
*G03F 1/66* (2012.01)

(52) U.S. Cl.
CPC ............... *G03F 1/62* (2013.01); *G03F 1/64* (2013.01); *G03F 1/66* (2013.01); *G03F 7/707* (2013.01); *G03F 7/708* (2013.01); *G03F 7/70808* (2013.01); *G03F 7/70825* (2013.01); *G03F 7/70833* (2013.01)

(58) Field of Classification Search
None
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2004/0135986 A1* | 7/2004 | Lee | G03F 7/70983 355/75 |
| 2012/0140199 A1* | 6/2012 | Hotzel | G03F 1/64 355/75 |
| 2013/0065160 A1* | 3/2013 | Lao | G03F 1/64 430/5 |

* cited by examiner

Primary Examiner — Michelle M Iacoletti
(74) Attorney, Agent, or Firm — McClure, Qualey & Rodack, LLP

(57) ABSTRACT

A pellicle assembly is provided. The pellicle assembly includes a frame and a membrane connected to the frame. The pellicle assembly also includes housing connected to the frame. The pellicle assembly further includes capping member passing through an upper opening of the housing and movable along a longitudinal axis of the housing. In addition, the pellicle assembly includes fastening member connected to the capping member and movable along a direction that is perpendicular to the longitudinal axis. When the capping member is in a released position, the fastening member is located within the housing, and when the capping member is in a fastening position, a portion of the fastening member is moved to the outside of the housing for fixing a mask.

20 Claims, 11 Drawing Sheets

PELLICLE ASSEMBLY IN PHOTOLITHOGRAPHY PROCESS AND METHOD FOR USING THE SAME

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a lithography process is limited by the wavelength of the projected radiation source. Lithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

In the photolithography process, a photo mask (or mask) is used. The mask includes a patterned image that may be used to transfer circuit and/or device patterns onto a semiconductor wafer by the photolithography system. Defects are not allowed to be formed on the photo mask, in order to achieve a high-fidelity pattern transfer from the patterned photo mask to the semiconductor substrate. Particles deposited on the surface of the photo mask may cause the lithographically transferred patterns to degrade. Particles may be introduced by any of a variety of methods such as during a chemical mechanical polishing (CMP) process, a cleaning process, and/or during the handling of the photo mask.

Consequently, it is desirable to provide a solution for protecting the photo mask from falling particles.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
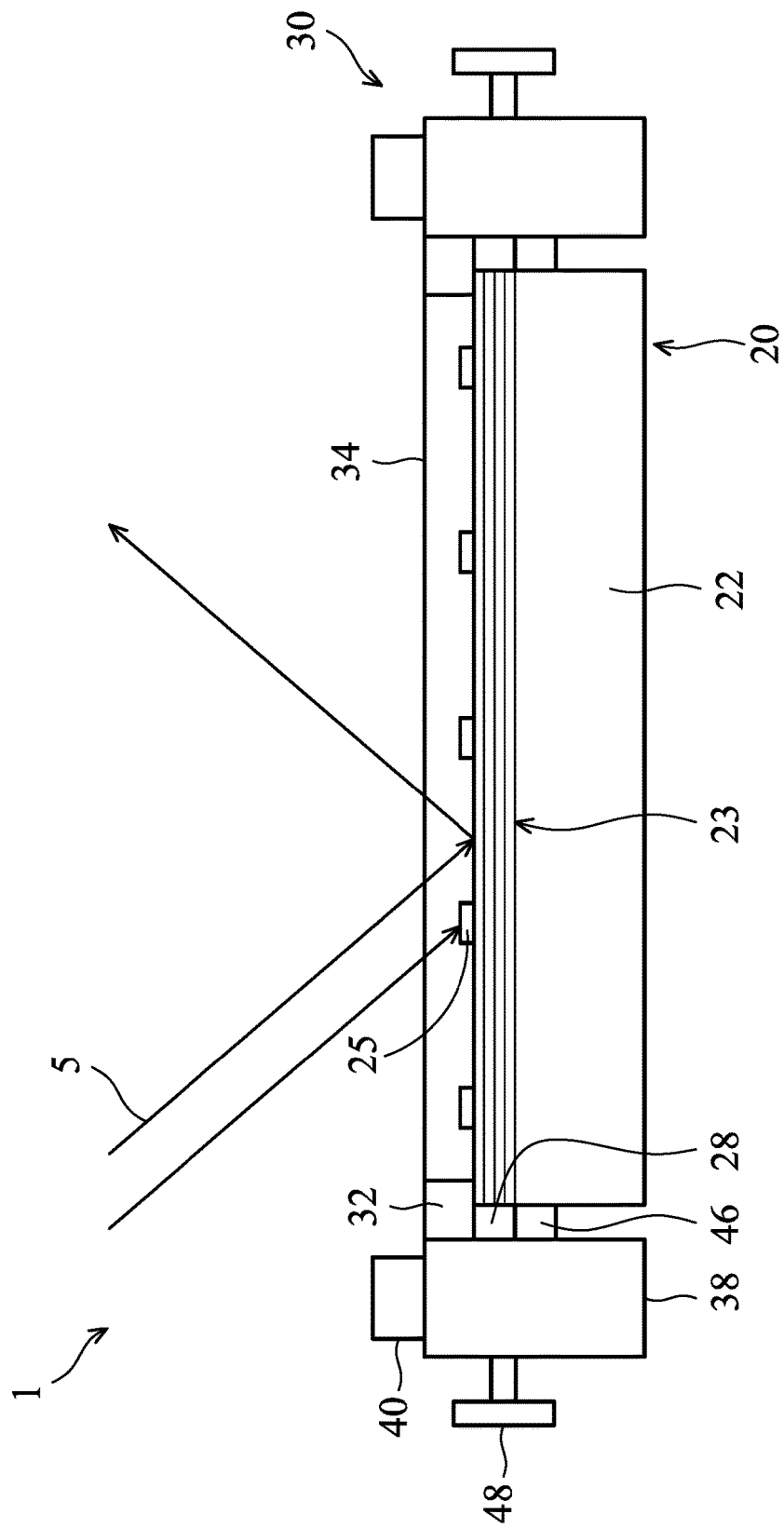
FIG. 1 is a schematic diagram of a photo mask module for performing a photolithography process, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 shows a schematic diagram of a processing tool 1 for performing a photolithography process in semiconductor fabrication, in accordance with some embodiments. In some embodiments, the processing tool 1 pertains to extreme ultraviolet (EUV) lithography and includes a photo mask 20 and a pellicle assembly 30. The elements of the processing tool 1 can be added to or omitted, and the invention should not be limited by the embodiment.

In some embodiments, the photo mask 20 may include a substrate 22, a multi-layer structure 23, one or more absorbers 25 and one or more protrusions 28.

Figure 2:
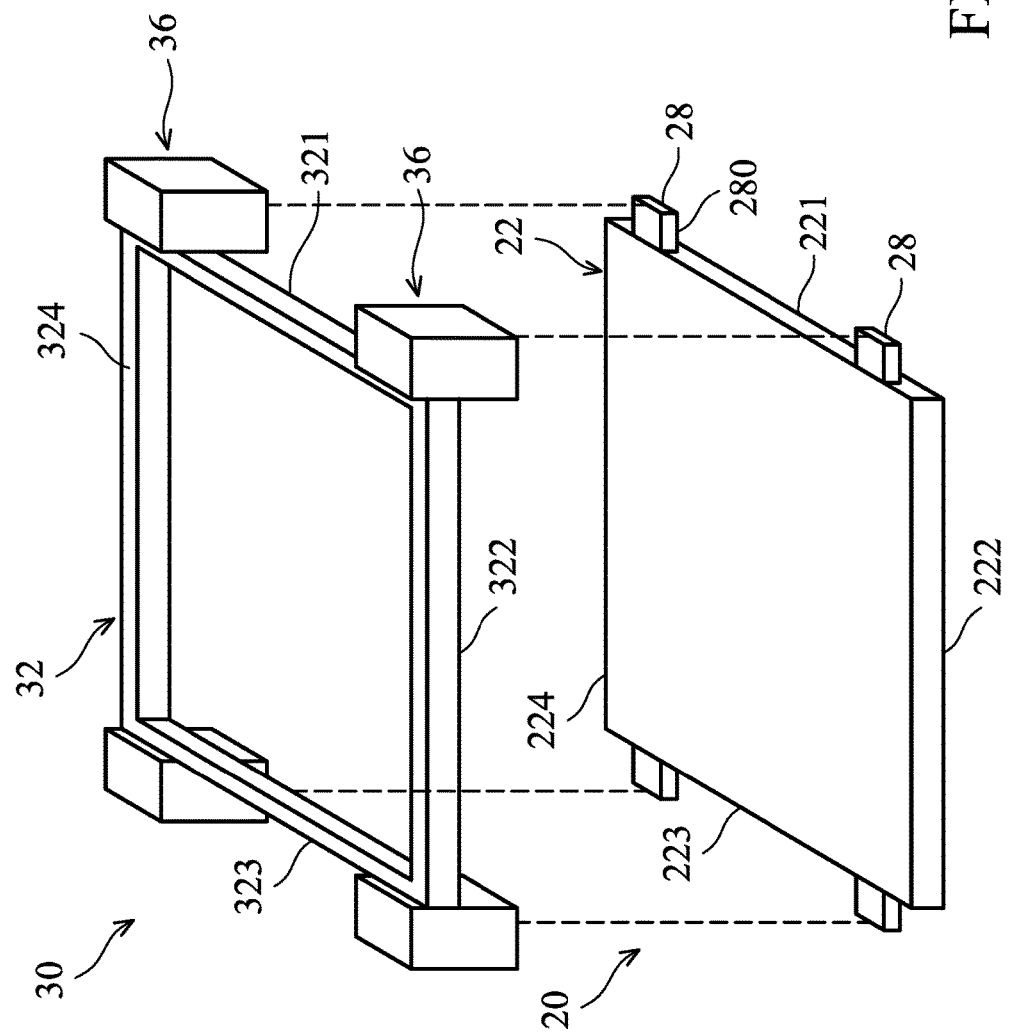
FIG. 2 shows an exploded view of a photo mask module for performing a photolithography process, in accordance with some embodiments.

In some embodiments, the substrate 22 has a rectangular shape and includes four edges 221-224 (shown in FIG. 2). The edges 221-224 are connected to each other in order. The substrate 22 may include a low thermal expansion material (LTEM) substrate (e.g., such as TiO2 doped SiO2). In some examples, substrate 22 has a thickness of about 6.3 to 6.5 mm.

In some embodiments, as shown in FIG. 2, four protrusions 28 are positioned at four corners of the substrate 22 and extend outwardly from the edge of the substrate 22. For example, two protrusions 28 are connected to two ends of the edge 221, and two protrusions 28 are connected to two ends of the edge 223. The protrusions 28 have a uniform thickness in the extending direction that is parallel to the extending plane of the substrate 22. The thickness of each protrusion 28 is less than the thickness of the substrate 22. In some embodiments, the protrusions 28 and the substrate 22 are formed integrally. However, it should be appreciated that many variations and modifications can be made to embodiments of the disclosure.

Figure 3B:
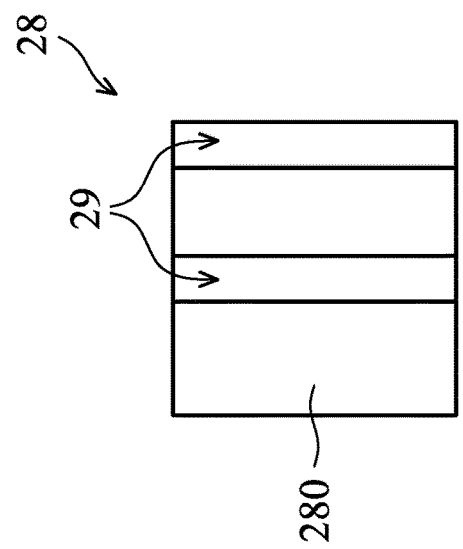
FIG. 3B shows a bottom view of a portion of a photo mask, in accordance with some embodiments.
Figure 3A:
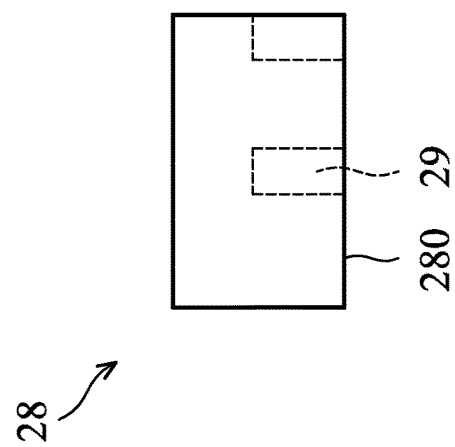
FIG. 3A shows a side view of a portion of a photo mask, in accordance with some embodiments.

In addition, as shown in FIGS. 3A and 3B, there are a number of grooves 29 formed on the bottom surface 280 of each protrusion 28. The advantage of the grooves 29 will be described in more detail later.

Referring back to FIG. 1, the multi-layer structure 23 is configured to reflected the incident EUV light 5 (e.g., with a wavelength of about 13.5 nm) to a semiconductor wafer (not shown in figures). In some embodiments, the multi-layer structure 23 includes molybdenum-silicon (Mo—Si) multi-layers deposited on top of the substrate 22. The multi-layer structure 23 may be formed on the substrate by, for example, using an ion deposition technique. The multi-layer structure 23 may have a thickness of about 250 nm to about 350 nm, and in some examples each Mo—Si layer pair has a thickness of about 3 nm (for the Mo layer) and about 4 nm (for the Si layer).

The absorbers 25 are configured to absorb EUV light 5. The absorbers 25 may include for example, a $Ta_xN_y$ layer or a $Ta_xB_yO_2Nu$ layer, which may have a thickness of about 50-75 nm. In some examples, other materials may be used for the absorbers 25, such as Al, Cr, Ta, and W, among others.

It should be appreciated that while some examples of materials that may be used for each of the substrate 22, the multi-layer structure 23 and the absorbers 25 have been given, it will be understood that other suitable materials as known in the art may be used without departing from the scope of the present disclosure.

The pellicle assembly 30 includes a membrane 34, a frame 32 and a fastening mechanism 36. The membrane 34 is connected to the frame 32. The membrane 34 is configured to prevent contaminant particles from landing on the photo mask 20 and degrading the result of photolithography process (e.g., by keeping contaminant particles away from a plane of focus of the photo mask 20).

The membrane 34 may include a film having a substantially uniform thickness. In some embodiments, the membrane 34 may have a thickness having a range of between approximately 50 nm and approximately 200 nm.

In various embodiments, the membrane 34 may include crystalline silicon having a homogenous crystalline framework. In other embodiments, the membrane 34 may include a material having a high Young's modulus (e.g., greater than 750 GPa) such as carbon nanotubes (having a Young's modulus of approximately 1,000 GPa), graphene (having a Young's modulus of approximately 1,000 GPa), or diamond (having a Young's modulus of approximately 1,220 GPa).

The frame 32 is configured to support the membrane 34 so that the membrane 34 is suspended a standoff distance away from the patterned surface on the photo mask 20. In some embodiments, the frame 32 has a rectangular shape and includes a number of sub-segments, such as sub-segments 321-324. The sub-segments 321-324 are connected to each other in order.

In some embodiments, as shown in FIG. 2, the four fastening mechanisms 36 are positioned at four corners of the frame 32 and connected to the outer surface of the corresponding sub-segments 321-324. For example, two fastening mechanisms 36 are connected to two ends of the sub-segment 321, and two fastening mechanisms 36 are connected to two ends of the sub-segment 323.

The structural features of one of the fastening mechanisms 36, in accordance with some embodiments, are described below.

Figure 4:
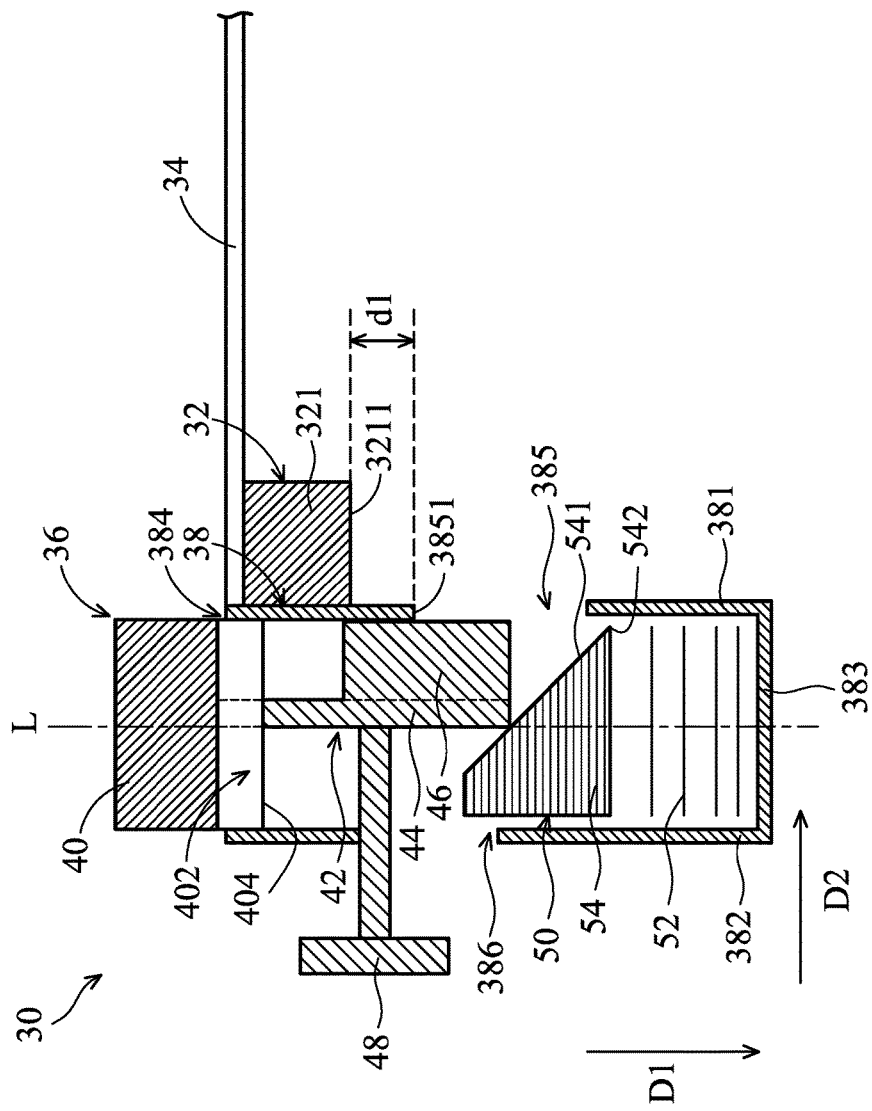
FIG. 4 shows a schematic cross-sectional view of a pellicle assembly, in accordance with some embodiments.

FIG. 4 shows a cross-sectional view of the processing tool 1. The fastening mechanism 36 includes a housing 38, a capping member 40, a fastening member 42, a releasing member 48 and a compression unit 50. The elements of the fastening mechanism 36 can be added to or omitted, and the invention should not be limited by the embodiment.

The housing 38 is a hollowed structure and extends in a longitudinal axis L that is perpendicular to a plane on which the membrane 34 extends. In some embodiments, the housing 38 includes a number of side panels, such as inner side panel 381, an outer side panel 382. The inner side panel 381 is connected to the sub-segment 321 of the frame 32. The outer side panel 382 is arranged opposite to the inner side panel 381. The housing 38 and the frame 32 can be formed integrally. In an alternative, the housing 38 is fixed on the frame 32 by suitable means such as screwing.

In addition, the housing 38 includes a bottom panel 383 connecting to the lower end of the side panels. For example, the bottom panel 383 connects the lower end of the inner side panel 381 to the lower end the outer side panel 382. An upper opening 384 is formed in one end of the housing and located in the longitudinal axis. The upper opening 384 is located opposite to the bottom panel 383.

In some embodiments, an inner side opening 385 is formed on the inner side panel 381, and an outer side opening 386 is formed on the outer side panel 382. There is a distance dl formed between the upper edge 3851 of the inner side opening 385 a bottom surface 3211 of the sub-segment 321 of the frame 32. The distance dl may be substantially equal to or slightly smaller than the thickness of the protrusion 28 (FIG. 2) in the direction that is parallel to the longitudinal axis L for facilitating the engagement of the fastening member 42 to the protrusion 28. The method for engaging the fastening member 42 to the protrusion 28 will be described in more detail later.

The capping member 40 is positioned in the opening 384 in such a manner that the capping member 40 can be moved back and forth along a first direction D1 that is parallel to the longitudinal axis L. A guiding rail 402 is formed on the bottom surface 404 of the capping member 40 and is configured to guide the movement of the fastening member 42 in the second direction D2. The guiding rail 402 extends along a second direction D2 that is perpendicular to the longitudinal axis L.

The fastening member 42 includes a longitudinal portion 44 and an engaging portion 46. The longitudinal portion 44 extends a predetermined distance in direction D1. One end of the longitudinal portion 44 is connected to the guiding rail 402 of the push bottom 40 in such a manner that the longitudinal portion 44 is moveable forth and back along the second direction D2. The engaging portion 46 is connected to a lateral surface of the longitudinal portion 44 that faces the inner side panel 381. The engaging portion 46 extends inwardly away from the longitudinal portion 44 along the second direction D2.

In some embodiments, the width of the engaging portion 46 in a first direction D1 that is parallel to the inner side wall 381 is substantially equal to or slightly less than the width of the protrusion 28 of the photo mask 20 (FIG. 1) in the first direction D1 so as to stably fix the photo mask 20 on the pellicle assembly 30. However, it should be appreciated that many variations and modifications can be made to embodiments of the disclosure.

The width of the engaging portion 46 can be determined according to the friction force formed between the protrusion 28 and engaging portion 46 as a contact is created between the protrusion 28 and engaging portion 46.

In some embodiments, the thickness of the engaging portion 46 (i.e., the width in the first direction D1) is smaller than the width of the inner opening 385 in the vertical direction. The thickness of the engaging portion 46 can be determined according to the desired structural strength.

In some embodiments, the bottom surface of the engaging portion 46 is flush with the bottom surface of the longitudinal portion 44. As a result, the fastening member 42 has an L-shape in cross section. However, it should be appreciated that many variations and modifications can be made to embodiments of the disclosure.

In some embodiments, the bottom surface of the engaging portion 46 can be higher than the bottom surface of the longitudinal portion 44, and there is a height difference formed between the bottom surface of the engaging portion 46 and the bottom surface of the longitudinal portion 44. In this case, the fastening member 42 may has a T-shape in cross section.

The releasing member 48 is configured to retrieve the fastening mechanism 36 from a fastening position to an engaging released position so as to release the photo mask 20. In some embodiments, as shown in FIG. 4, the releasing member 48 is connected to a lateral surface of the longitudinal portion 44 that faces the outer side panel 382. The releasing member 48 extends away from the longitudinal portion 44 along a direction opposite to the second direction D2. In some embodiments, the releasing member 48 normally passes through the outer opening 386 of the housing 38, and the releasing member 48 has a T-shape in cross section for facilitating the holding of operating personnel or a robotic arm. In some embodiments, the releasing member 48 is omitted.

The compression unit 50 is configured to guide the movement of the fastening member 42 in the second direction D2. In some embodiments, the compression unit 50 is also configured to provide a force toward the fastening member 42 so as to securely held the photo mask 20. In some embodiments, the compression unit 50 includes a flexible member 52 and a sliding block 54.

The flexible member 52 is located in the housing 38 and positioned on the bottom panel 383 of the housing 38. The flexible member 52 may be a spring or an elastic string in oil pressure cylinder. In some embodiments, after the flexible member 52 is compressed by a thrust force toward the bottom panel 383, the flexible member 52 pushes back against the thrust force and tries to get back to its original state.

The sliding block 54 is located in the housing 38 and connected to the bottom panel 383 via the flexible member 52. The sliding block 54 may have a trapezoidal cross section and have an inclined surface 541 that is tilted relative to the longitudinal axis L. The inclined surface 541 faces the inner opening 385 of the housing 38. A lower edge 542 (i.e., the edge that is close to the bottom panel 383) of the inclined surface 541 is located below the inner opening 385. The tilted angle of the inclined surface 541 relative to the longitudinal axis L may be in a range from about 30 degrees to about 60 degrees.

Figure 5:
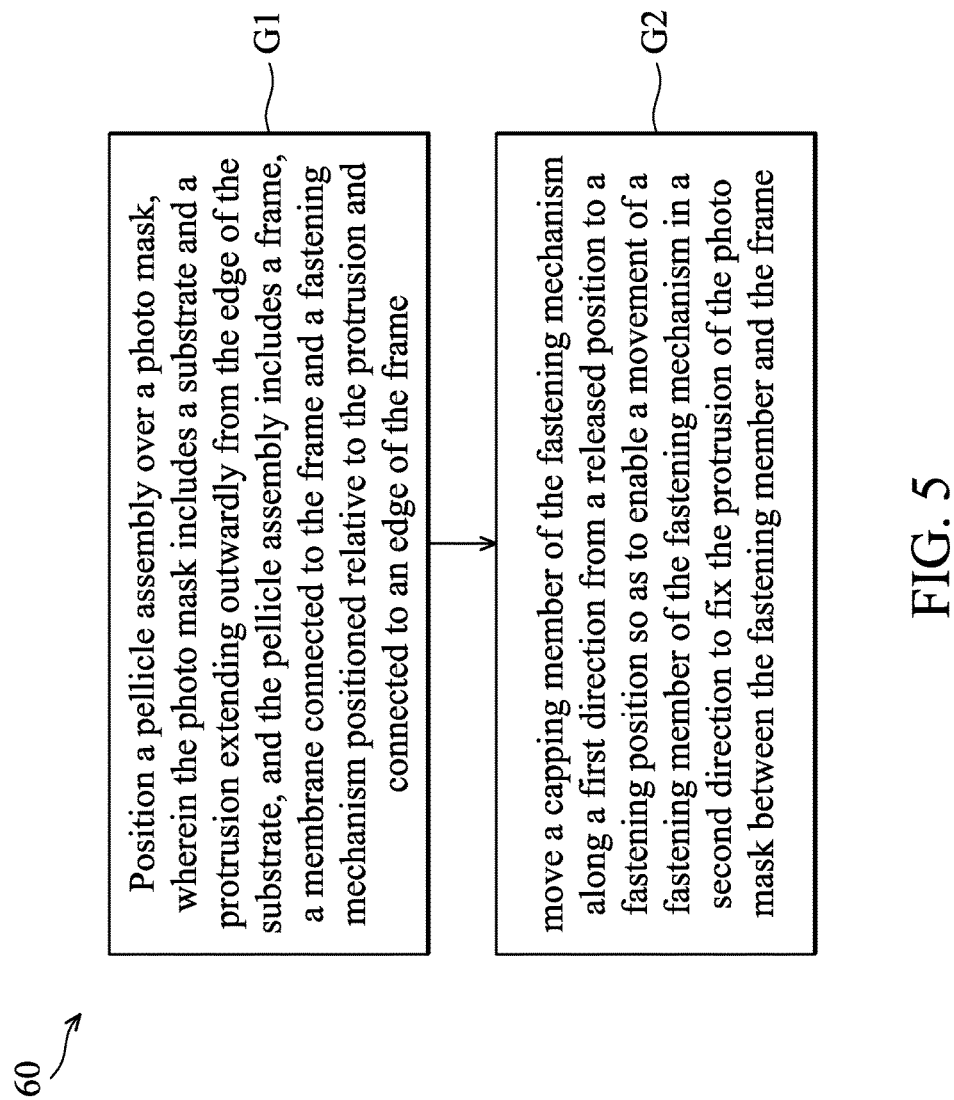
FIG. 5 shows a flow chart of a method for assembling a photo mask on a pellicle assembly, in accordance with some embodiments.

FIG. 5 is a flow chart illustrating a method 60 for mounting a pellicle assembly 30 on a photo mask 20, in accordance with some embodiments. For illustration, the flow chart will be described to accompany the cross-sectional view shown in FIGS. 6-8. Some of the described stages can be replaced or eliminated in different embodiments. Additional features can be added to the semiconductor device structure. Some of the features described below can be replaced or eliminated in different embodiments.

Figure 6:
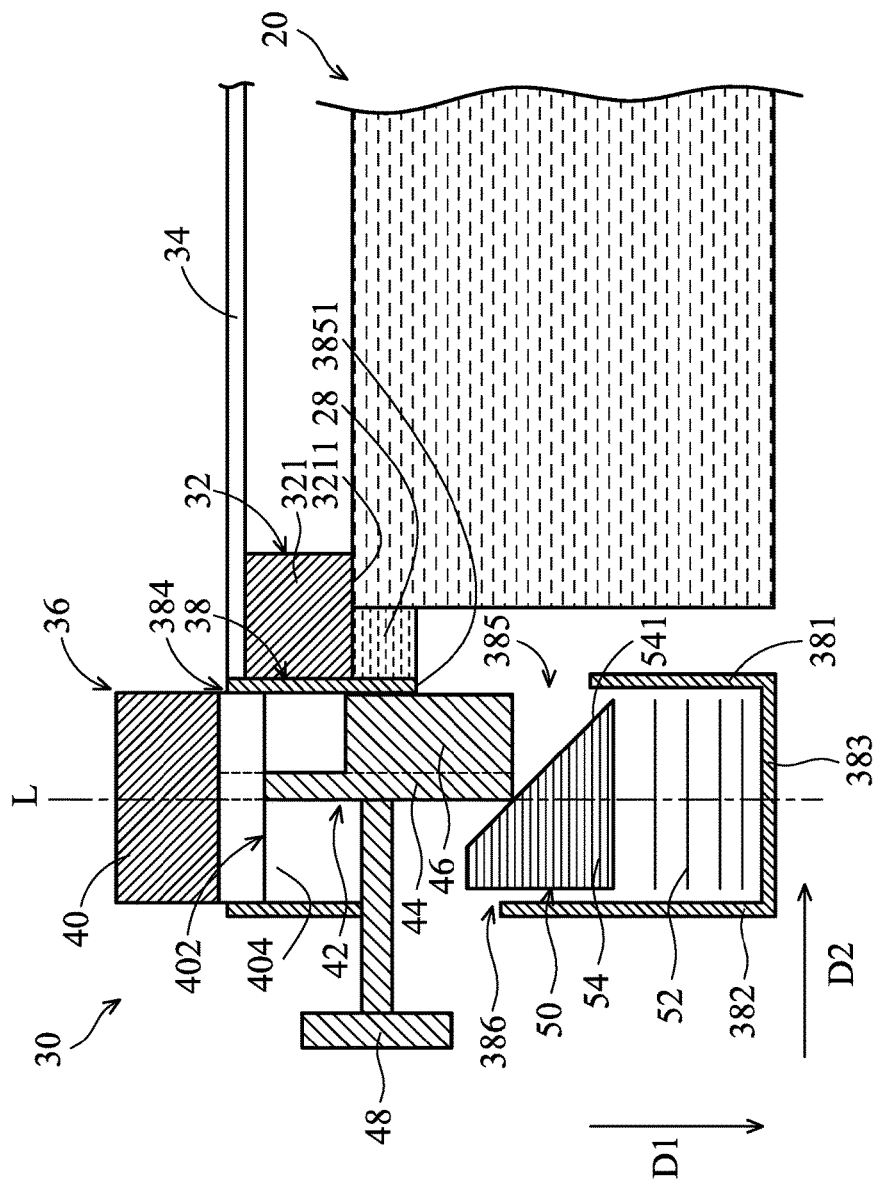
FIG. 6 shows a schematic cross-sectional view of one stage of a method for assembling a photo mask on a pellicle assembly as a capping member is being located in the released position, in accordance with some embodiments.

The method 60 begins with an operation 61, in which the pellicle assembly 30 is positioned over the photo mask 20. In some embodiments, the protrusion 28 of the photo mask 20 is positioned relative to the fastening pellicle assembly 30 and connected to the bottom surface 3211 of the frame 32. In cases where the distance d1 formed between the inner side opening 385 and the frame 32 is substantially equal to the thickness of the protrusion 28, the bottom surface of the protrusion 28 is flush with the upper edge 3851 of the inner side opening 385, as shown in FIG. 6, when the pellicle assembly 30 is positioned over the photo mask 20. However, it should be appreciated that many variations and modifications can be made to embodiments of the disclosure. The bottom surface of the protrusion 28 may be lower (i.e., more close to the bottom panel 383) than the upper edge 3851 of the inner side opening 385 when the pellicle assembly 30 is positioned over the photo mask 20.

Figure 8:
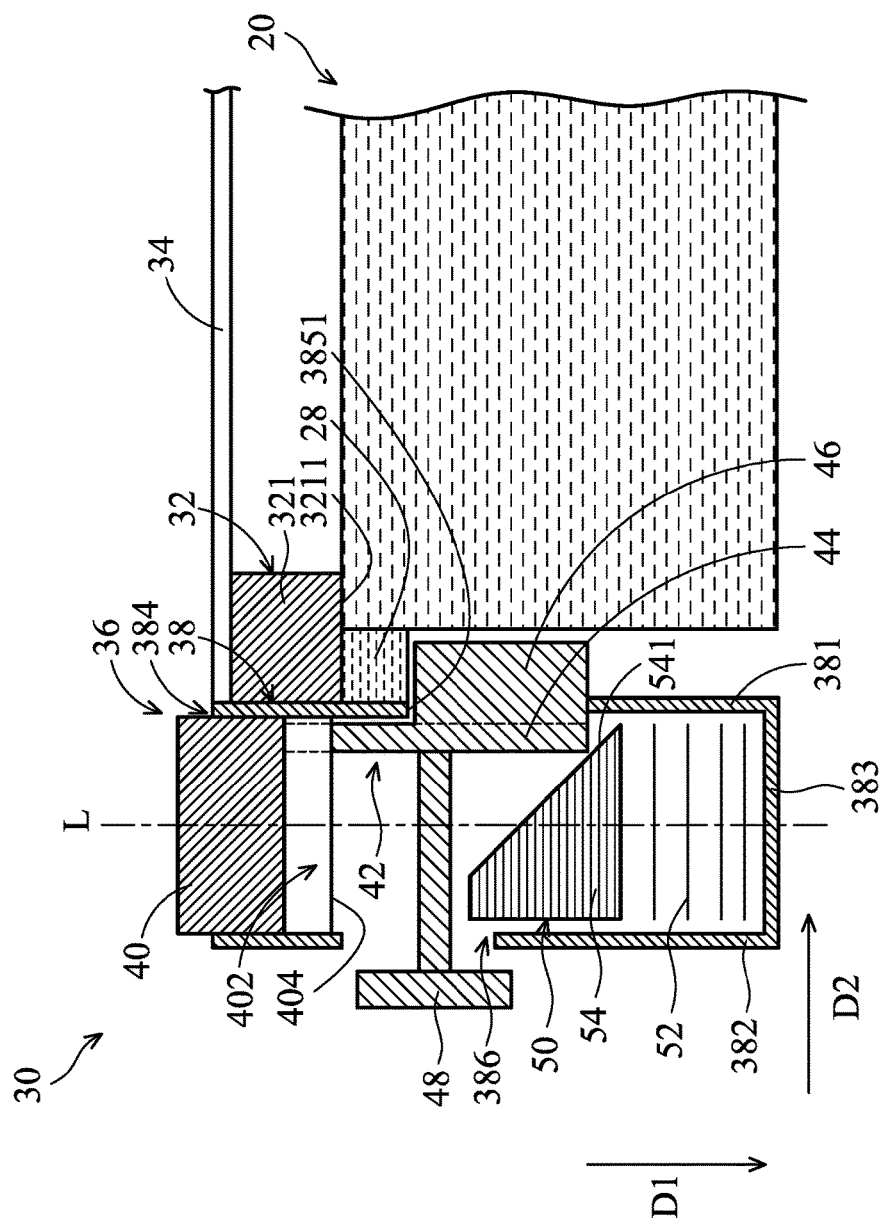
FIG. 8 shows a schematic cross-sectional view of one stage of a method for assembling a photo mask on a pellicle assembly as a capping member is being located in a fastening position, in accordance with some embodiments.

The method 60 continues to an operation 62, in which the capping member 40 of the fastening mechanism 36 is moved from a released position (FIG. 6) to a fastening position (FIG. 8). In some embodiments, in order to move the capping member 40 from the released position to the fastening position, the capping member 40 is pushed by a thrust force that is applied along the first direction D1. The thrust force may be applied by a robotic manipulator or a human.

While the capping member 40 is being moved, the fastening member 42 is moved downwardly and abutted against the inclined surface 541 of the compression unit 50. Due to the arrangements of the guiding rail 402 and the inclined surface 541, the movement of the fastening member 42 in the down direction causes the fastening member 42 moving toward to the inner side panel 381.

Figure 7:
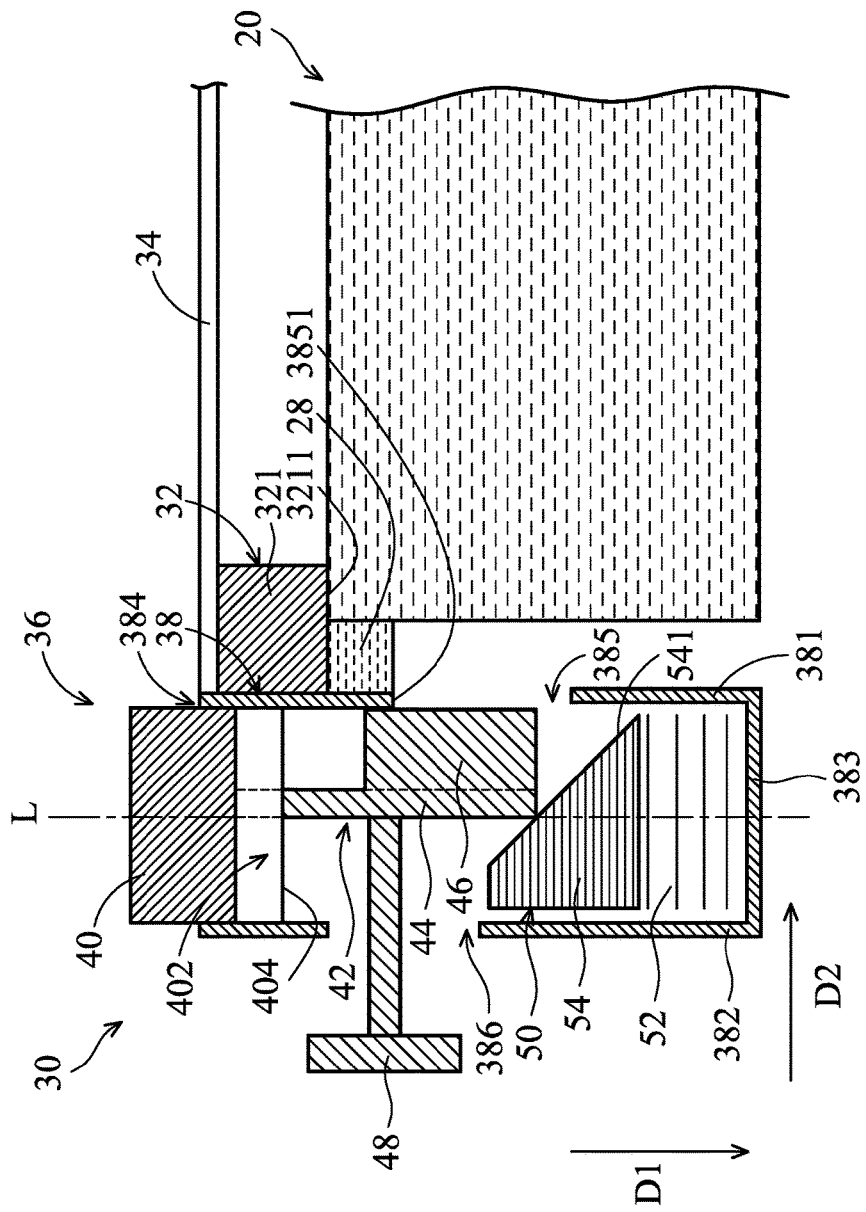
FIG. 7 shows a schematic cross-sectional view of one stage of a method for assembling a photo mask on a pellicle assembly as the capping member is being moved from the released position to the fastening position, in accordance with some embodiments.

When the engaging portion 46 of the fastening member 42 approaches a plane on which the inner side panel 381 is located, as shown in FIG. 6, since the engaging portion 46 is not aligned with the inner opening 385, the movement of the engaging portion 46 in the second direction D2 is stopped by the inner side panel 381. However, the movement of the engaging portion 46 in the first direction D1 is continued and the flexible member 52 is compressed by the applied thrust force, as shown in FIG. 7.

With the fastening member 42 being pushed lower and lower, the upper surface of the engaging portion 46 gradually approaches the upper edge 3851 of the inner opening 385. As shown in FIG. 8, once the capping member 40 is moved to the fastening position, the upper surface of the engaging portion 46 aligns with the upper edge 3851 of the inner opening 385, and the engaging portion 46 is allowed to pass through the inner opening 385. In this moment, the sliding block 54 is pushed upwardly by the restoring force produced by the flexible member 52, and the fastening member 42 is pushed by the sliding block 54 to move along the second direction D2. As a result, the engaging portion 46 is moved to the outside of the housing 38 via the inner opening 385, as shown in FIG. 8. In some embodiments, the projection of a portion of the engaging portion 46 that is moved to the outside of the housing in a direction that is opposite to the first direction is located on the frame 32.

After the engaging portion 46 is moved to the outside of the housing 38, the protrusion 28 of the photo mask 20 is abutted against by the engaging portion 46 to fix the protrusion 28 between the engaging portion 46 and the frame 32.

In cases where there is a flexible member 52 which provides a restoring force in the upward direction, the protrusion 28 of the photo mask 20 is securely held between the engaging portion 46 and the frame 32 by a restraining force N1 which satisfies the following equation $N1=(F-ky)*\cot \Theta$, wherein F is the thrust force applied on the capping member 40, k is the elastic constant of the flexible member 52, y is the deformation amount of the flexible member 52, and $\Theta$ is the included angle formed between the inclined surface 541 and the bottom surface of the sliding block 54.

It should be noted that, since the lower edge of the inclined surface 541 is located below the inner opening 385, particles generated due to surface friction between the fastening member 42 and the inclined surface 541 are collected in the housing 38 and do not fall on the photo mask 20. In addition, since there are grooves 29 (FIGS. 3A and 3B) formed on the bottom surface of the protrusion 28, particles generated due to surface friction between the engaging portion 46 and the protrusion 28 are collected in the grooves 29 and do not fall on the photo mask 20. Therefore, contamination of the photo mask 20 is avoided.

To release the photo mask 20 from the pellicle assembly 30, a pull force is applied on the releasing member 48 along the direction opposite to the second direction D2. In this moment, the fastening member 42 is moved along the direction opposite to the second direction D2 and the flexible member 52 is compressed by the fastening member 42 via the sliding member 54. Once the engaging portion 46 is withdrawn into the housing 38, the sliding block 54 is pushed upwardly by the restoring force produced by the flexible member 52, and the fastening member 42 is pushed by the sliding block 54 to move along a direction opposite to the first direction D1 until the capping member 40 is back to the released position.

In some embodiment's, the pull force F' applied on the releasing member 48 may be satisfied the following equation: $N2=(F'-ky')*\tan \Theta$, wherein N2 is the weight of the photo mask 20 applied on the engaging portion 46, k is the elastic constant of the flexible member 52, y' is the deformation amount of the flexible member 52 while the releasing member 48 is pulled back, and $\Theta$ is the included angle formed between the inclined surface 541 and the bottom surface of the sliding block 54.

Figure 9:
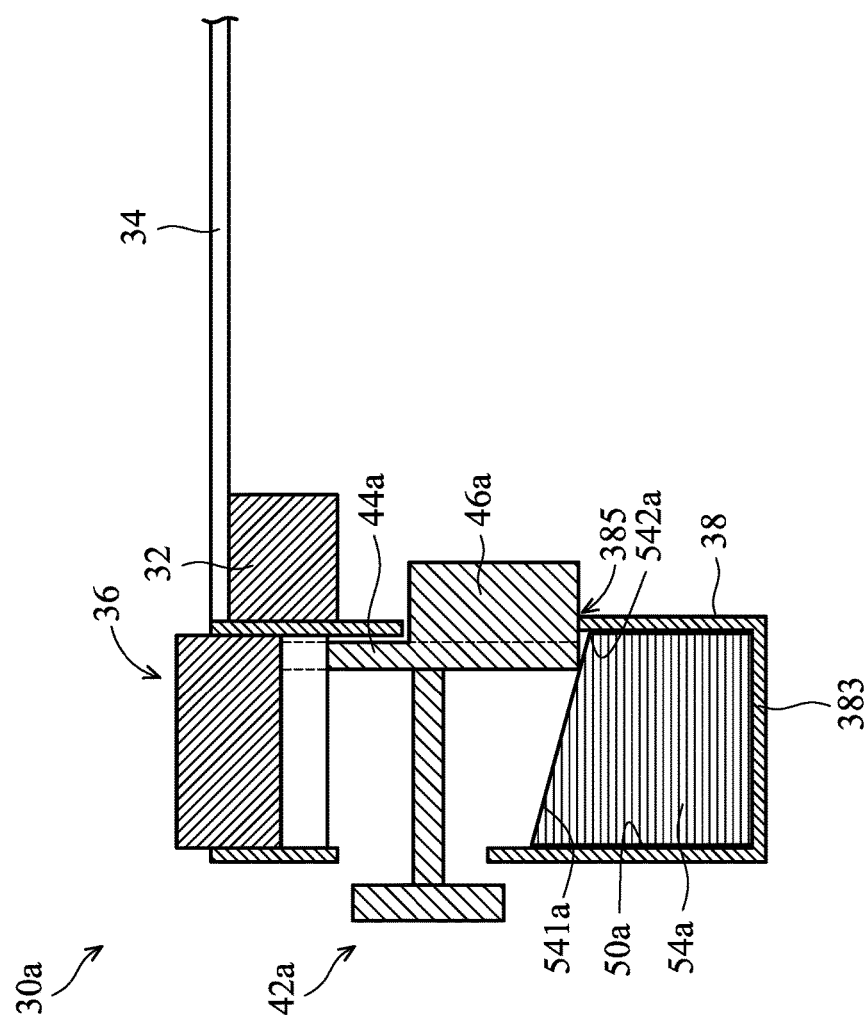
FIG. 9 shows a schematic cross-sectional view of a pellicle assembly as a capping member is being located in a fastening position, in accordance with some embodiments.

FIG. 9 shows a schematic cross-sectional view of a pellicle assembly 30a as a capping member is being located in a fastening position, in accordance with some embodiments. In the embodiment, elements that are identical with or similar to the elements of the pellicle assembly 30a shown in FIG. 4 are designated by the same reference numbers, and the features thereof are not repeated for the purpose of brevity. The difference between the pellicle assembly 30a and the pellicle assembly 30 includes the fastening member 42 being replaced by the fastening member 42a and the compression unit 50 being replaced by the compression unit 50a.

The fastening member 42a includes a longitudinal portion 44a and an engaging portion 46a. The structural features of the longitudinal portion 44a and the engaging portion 46a are similar to the longitudinal portion 44 and an engaging portion 46 shown in the embodiment of FIG. 4. However, the engaging portion 46a is made of compressible material such as rubber.

The compression unit 50a includes a sliding block 54a. The sliding block 54a is fixed in the housing 38 and directly connected to the bottom panel 383. The sliding block 54a may have a trapezoidal cross section and have an inclined surface 541a that is tilted relative to the longitudinal axis L. The inclined surface 541a faces the inner opening 385 of the housing 38. A lower edge (i.e., the edge that is close to the bottom panel 383) of the inclined surface 541a is located below the inner opening 385. The tilted angle of the inclined surface 541a relative to the longitudinal axis L may be in a range from about 30 degrees to about 60 degrees.

When the engaging portion 46a is moved to the outside of the housing 38 and is engaged with the protrusion 28 of photo mask 20 (FIG. 2), the engaging portion 46a may be compressed by the inclined surface 541a and the protrusion 28 to securely hold the photo mask 20 on the pellicle assembly 30a. In some embodiments, the projection of the engaging portion 46a in a direction that is opposite to the first direction is located on the frame 32.

Figure 10:
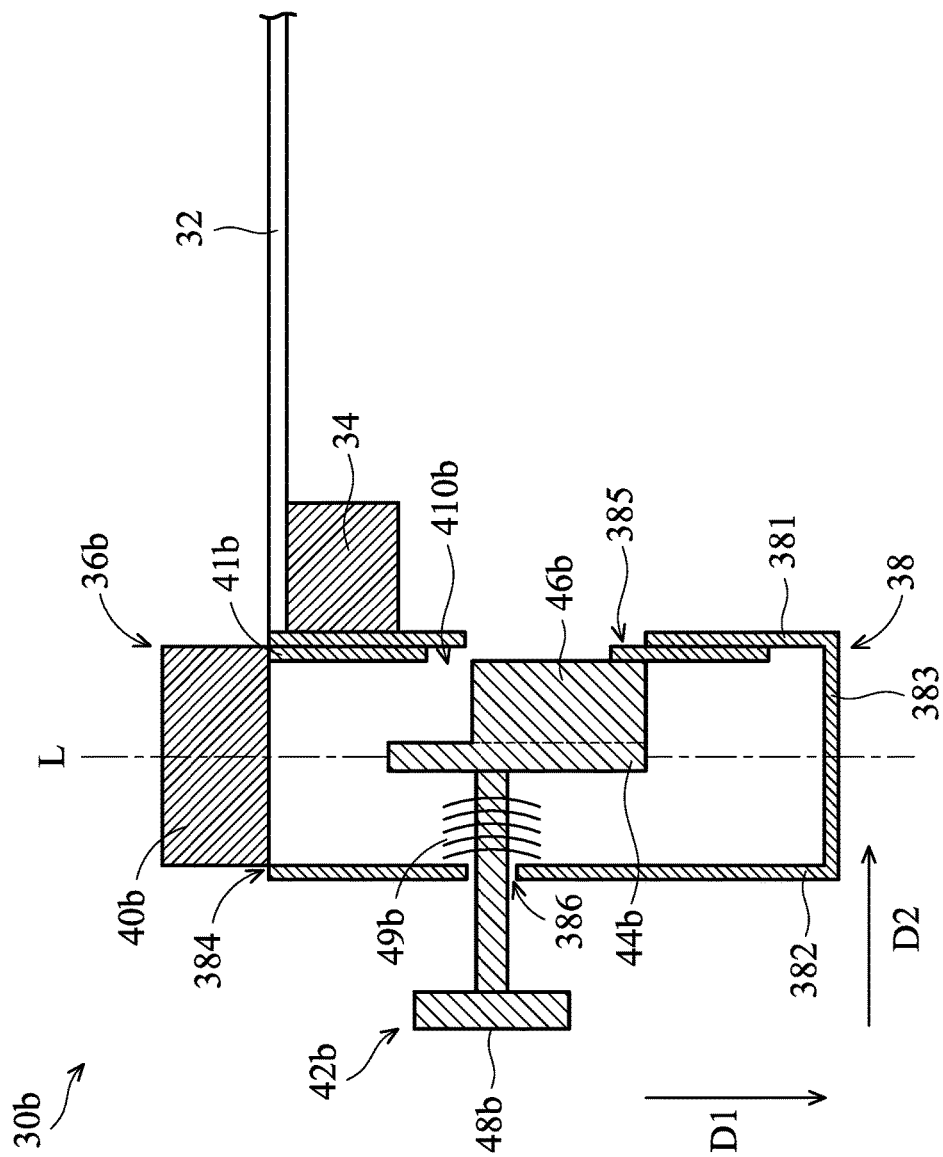
FIG. 10 shows a schematic cross-sectional view of a pellicle assembly as a capping member is being located in a released position, in accordance with some embodiments.
Figure 11:
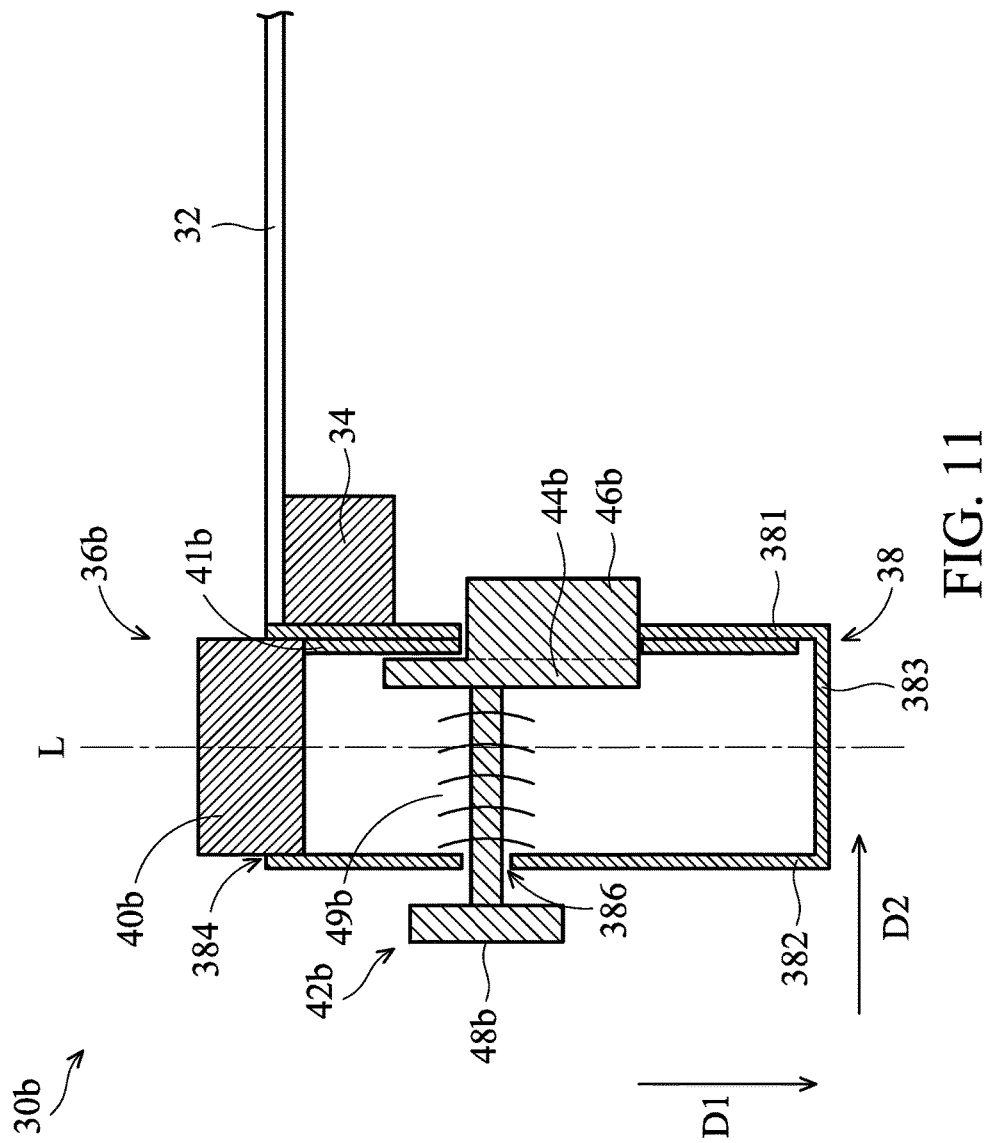
FIG. 11 shows a schematic cross-sectional view of a pellicle assembly as a capping member is being located in a fastening position, in accordance with some embodiments.

FIG. 10 shows a schematic cross-sectional view of a pellicle assembly as a capping member is being located in a released position, in accordance with some embodiments. FIG. 11 shows a schematic cross-sectional view of a pellicle assembly as a capping member is being located in a fastening position, in accordance with some embodiments. In the embodiment, elements that are identical with or similar to the elements of the pellicle assembly 30b shown in FIG. 4 are designated by the same reference numbers, and the features thereof are not repeated for the purpose of brevity. The difference between the pellicle assembly 30b and the pellicle assembly 30 includes the pellicle assembly 30b including a capping member 40b, a switch member 41b, a fastening member 42b, a releasing member 48a and a flexible member 49b.

In some embodiments, the capping member 40b is positioned in the opening 384 in such a manner that the capping member 40b can be moved back and forth along a first direction D1 that is parallel to the longitudinal axis L. In some embodiments, the switch member 41b is a board having a through hole 410b. The dimensions of the through hole 410b may be the same as that of the inner opening 385 of the housing 38.

In some embodiments, the fastening member 42b includes a longitudinal portion 44b and an engaging portion 46b. The longitudinal portion 44b extends a predetermined distance in direction D1. The engaging portion 46b is connected to a lateral surface of the longitudinal portion 44b that faces the inner side panel 381. The engaging portion 46b extends away from the longitudinal portion 44b along the second direction D2. The height of the engaging portion 46b in the direction D1 is less than the height of the longitudinal portion 44b in the direction D1.

The releasing member 48 is configured to manipulate the movement of the fastening member 42b. In some embodiments, as shown in FIG. 4, the releasing member 48b is connected to a lateral surface of the longitudinal portion 44b that faces the outer side panel 382. The releasing member 48b extends away from the longitudinal portion 44b along a direction opposite to the second direction D2. In some embodiments, the releasing member 48b normally passes through the outer opening 386 of the housing 38, and the releasing member 48b has a T-shape in cross section for facilitating the holding of operating personnel or a robotic arm.

The flexible member 49b surrounds the releasing member 48b and connects the outer side panel 382 to the fastening member 42b. The flexible member 49b may be a spring. In some embodiments, after the flexible member 49b is compressed by a pull force toward the outer side panel 382, the flexible member 49b pushes back against the pull force and tries to get back to its original state.

When the capping member 40b is in the released position, the flexible member 49b is in a compressed state. The inner opening 385 is blocked by the switch member 41b. When the capping member 40b of the fastening mechanism 36b is moved from a released position (FIG. 10) to a fastening position (FIG. 11), the capping member 40b is pushed by a thrust force that is applied along the first direction D1. While the capping member 40b is being moved, the switch member 41b is moved downwardly.

Afterwards, as shown in FIG. 11, once the capping member 40b is moved to the fastening position, the through hole 410b of the switch member 41b is aligned with the inner opening 385 of the housing 38. In this moment, the engaging portion 46b is pushed toward the inner side panel 381 by the restoring force produced by the flexible member 49b to move along the second direction D2. As a result, as shown in FIG. 11, the engaging portion 46b is moved to the outside of the housing 38 via the inner opening 385 to securely hold the photo mask 20 (FIG. 2) on the pellicle assembly 30b. In some embodiments, the projection of a portion of the engaging portion 46b that is moved to the outside of the housing in a direction that is opposite to the first direction is located on the frame 32.

Embodiments of a pellicle assembly include a fastening mechanism to hold a photo mask. The fastening mechanism enables the pellicle frame to be attached to the photo mask and removed from the photo mask without damaging the photo mask. Therefore, the life span of the photo mask is prolonged, reducing the manufacturing cost. In addition, contaminated particles produced during the assembly of the pellicle assembly on the photo mask are collected in a specific area and do not cause the photo mask to become contaminated. As a result, the processing quality and the production yield are improved.

In accordance with some embodiments, a pellicle assembly is provided. The pellicle assembly includes a frame and a membrane connected to the frame. The pellicle assembly also includes housing extending in a longitudinal axis and connected to the frame, wherein an upper opening is formed in one end of the housing and located in the longitudinal axis. The pellicle assembly further includes capping member passing through the upper opening and movable along the longitudinal axis from a released position to a fastening position. In addition, the pellicle assembly includes fastening member connected to the capping member and movable along a direction that is perpendicular to the longitudinal axis. When the capping member is in the released position, the fastening member is located within the housing, and when the capping member is in the fastening position, a portion of the fastening member is moved to the outside of the housing.

In accordance with some embodiments, a processing tool is provided. The processing tool includes a photo mask including a substrate and a protrusion. The protrusion extends outwardly from an edge of the substrate. The processing tool also includes a pellicle assembly. The pellicle assembly includes a frame positioned on the substrate. The pellicle assembly also includes a membrane connected to a side of the frame that is opposite to the side where the substrate is connected to the frame. The pellicle assembly further includes a fastening mechanism positioned relative to the protrusion and connected to the frame. The fastening mechanism includes an engaging portion extending inwardly, and the protrusion of the photo mask is positioned between the frame and the engaging portion.

In accordance with some embodiments, a method for assembling a processing tool used in a photolithography process is provided. The method includes positioning a pellicle assembly over a photo mask. The photo mask includes a substrate and a protrusion extending outwardly from the edge of the substrate. The pellicle assembly includes a frame, a membrane connected to the frame and a fastening mechanism positioned relative to the protrusion and connected to an edge of the frame. The method also includes moving a capping member of the fastening mechanism along a first direction from a released position to a fastening position. The movement of the capping member enables a fastening member of the fastening mechanism to move in a second direction that is different from the first direction, and the protrusion of the photo mask is fixed between the fastening member and the frame.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A pellicle assembly, comprising
a frame;
a membrane connected to the frame; and a housing extending in a longitudinal axis and connected to the frame, wherein an upper opening is formed in one end of the housing and located in the longitudinal axis;

a capping member passing through the upper opening and movable along the longitudinal axis from a released position to a fastening position; and a fastening member connected to the capping member and movable along a direction that is perpendicular to the longitudinal axis;

wherein when the capping member is in the released position, the fastening member is located within the housing, and when the capping member is in the fastening position, a portion of the fastening member is moved to the outside of the housing.

2. The pellicle assembly as claimed in claim 1, wherein the fastening member comprises:

a longitudinal portion connected to the capping member and extending along a direction that is parallel to the longitudinal axis; and an engaging portion connected to the longitudinal portion and extending along the direction that is perpendicular to the longitudinal axis;

wherein when the capping member is in the fastening position, the engaging portion of the fastening member is moved to the outside of the housing.

3. The pellicle assembly as claimed in claim 1, wherein the capping member comprises a guiding rail, and the fastening member is connected to the guiding rail and movable on the guiding rail.

4. The pellicle assembly as claimed in claim 1, wherein the housing comprises an inner side panel, and the housing is connected to the frame via the inner side panel, wherein an inner opening is formed on the inner side panel, and the portion of the fastening member passes through the inner opening to move to the outside of the housing.

5. The pellicle assembly as claimed in claim 4, further comprising a compression unit positioned at a side of the fastening member that is opposite to a side where the capping member is located and comprising an inclined surface tilted relative to the longitudinal axis;

wherein a lower edge of the inclined surface is located below the inner opening and the fastening member is abutted against the inclined surface.

6. The pellicle assembly as claimed in claim 5, wherein the compression unit comprises:

a sliding block having the inclined surface; and a flexible member connected to the sliding block and configured for providing a thrust force over the sliding block so as to enable the contact of the sliding block and the fastening member.

7. The pellicle assembly as claimed in claim 1, further comprising a releasing member connected to the fastening member, when the capping member is in the fastening position, a portion of the releasing member is located outside of the housing.

8. A processing tool used in a photolithography process, comprising:

a photo mask comprising:
a substrate; and
a protrusion extending outwardly from an edge of the substrate; and a pellicle assembly comprising:
a frame positioned on the substrate;
a membrane connected to a side of the frame that is opposite to the side where the substrate is connected to the frame; and a fastening mechanism positioned relative to the protrusion and connected to the frame, wherein the fastening mechanism comprises an engaging portion, and the protrusion of the photo mask is positioned between the frame and the engaging portion.

9. The processing tool as claimed in claim 8, wherein the fastening mechanism further comprises:

a housing extending in a longitudinal axis and connected to the frame, wherein an upper opening is formed in one end of the housing and located in the longitudinal axis;

a capping member passing through the upper opening and movable along the longitudinal axis from a released position to a fastening position; and a fastening member comprising the engaging portion and connected to the capping member and movable along a direction that is perpendicular to the longitudinal axis;

wherein when the capping member is in the released position, the engaging portion is located within the housing, and when the capping member is in the fastening position, the engaging portion is moved to the outside of the housing to come into contact with the protrusion.

10. The processing tool as claimed in claim 9, wherein the capping member comprises a guiding rail, and the fastening member is connected to the guiding rail and movable on the guiding rail.

11. The processing tool as claimed in claim 9, wherein the housing comprises an inner side panel, and the fastening mechanism is connected to the frame via the inner side panel, wherein an inner opening is formed on the inner side panel, and the engaging portion passes through the inner opening to move to the outside of the housing.

12. The processing tool as claimed in claim 9, further comprising a compression unit positioned at a side of the fastening member, which is the side where the capping member is located;

wherein the compression unit has an inclined surface tilted relative to the longitudinal axis, and the fastening member is abutted against the inclined surface.

13. The processing tool as claimed in claim 12, further comprising a compression unit positioned at the side of the fastening member that is opposite to the side where the capping member is located and comprising an inclined surface tilted relative to the longitudinal axis;

wherein a lower edge of the inclined surface is located below the inner opening and the fastening member is abutted against the inclined surface.

14. The processing tool as claimed in claim 9, further comprising a releasing member connected to the fastening member, and when the capping member is in the fastening position, a portion of the releasing member is located outside of the housing.

15. The processing tool as claimed in claim 8, wherein the photo mask further comprises:

a plurality of reflective layers positioned on the substrate; and a plurality of absorbers formed on the reflective layers.

16. The processing tool as claimed in claim 8, wherein a plurality of grooves are formed on a surface of the protrusion that is in direct contact with the engaging portion.

17. A method for assembling a processing tool used in a photolithography process, comprising:

positioning a pellicle assembly over a photo mask, wherein the photo mask comprises a substrate and a protrusion extending outwardly from the edge of the substrate, and the pellicle assembly comprises a frame, a membrane connected to the frame and a fastening mechanism positioned relative to the protrusion and connected to an edge of the frame; and moving a capping member of the fastening mechanism along a first direction from a released position to a fastening position so as to enable a movement of a fastening member of the fastening mechanism in a second direction that is different from the first direction to fix the protrusion of the photo mask between the fastening member and the frame.

18. The method as claimed in claim 17, wherein the first direction is perpendicular to the second direction.

19. The method as claimed in claim 17, wherein moving the capping member along the first direction makes the fastening member contact an inclined surface that is tilted in the first direction.

20. The method as claimed in claim 17, wherein, in the movement of the fastening member in the second direction, the engaging portion is in contact with the protrusion.

* * * * *